United States Patent [19]

Biotteau

[11] Patent Number: 5,442,473
[45] Date of Patent: Aug. 15, 1995

[54] OPTICAL TELECOMMUNICATIONS METHOD

[75] Inventor: Bernard Biotteau, Arpajon, France

[73] Assignee: Alcatel N.V., Amsterdam, Netherlands

[21] Appl. No.: 34,396

[22] Filed: Mar. 18, 1993

[30] Foreign Application Priority Data

Mar. 18, 1992 [FR] France .................. 92 03244

[51] Int. Cl.⁶ .................. H04J 14/02; H04B 10/00
[52] U.S. Cl. .................. 359/124; 359/161; 359/183; 359/173
[58] Field of Search ............ 359/124, 125, 155, 183, 359/173, 161, 160; 372/25, 29, 30; 385/24, 18

[56] References Cited

U.S. PATENT DOCUMENTS 4,005,935  2/1977  Wang .................. 356/5
4,980,891  12/1990  Isadpanah .............. 372/25

FOREIGN PATENT DOCUMENTS 0504834  9/1992  European Pat. Off. ...... H04B 10/18
4028818  3/1992  Germany .............. H01S 3/108
61-102081  9/1986  Japan .............. H01S 3/133

*Primary Examiner*—Leo H. Boudreau
*Assistant Examiner*—Rafael Barares
*Attorney, Agent, or Firm*—Sughrue, Mion, Zinn, Macpeak & Seas

[57] ABSTRACT

A phase-modulated carrier wave is injected into a line fiber (4) by a semiconductor laser source (8, 10) to carry digital data to be transmitted. An optimum value for a permanent parameter of the carrier wave, in particular the phase deviation thereof, must be redefined from time to time because of drift in the characteristics of the source. This is done on the basis of the variations in the power of a diffracted wave that is caused to return via the fiber by Brillouin scattering in response to an incident wave emitted for this purpose by the same source. Application to telecommunications networks.

7 Claims, 1 Drawing Sheet

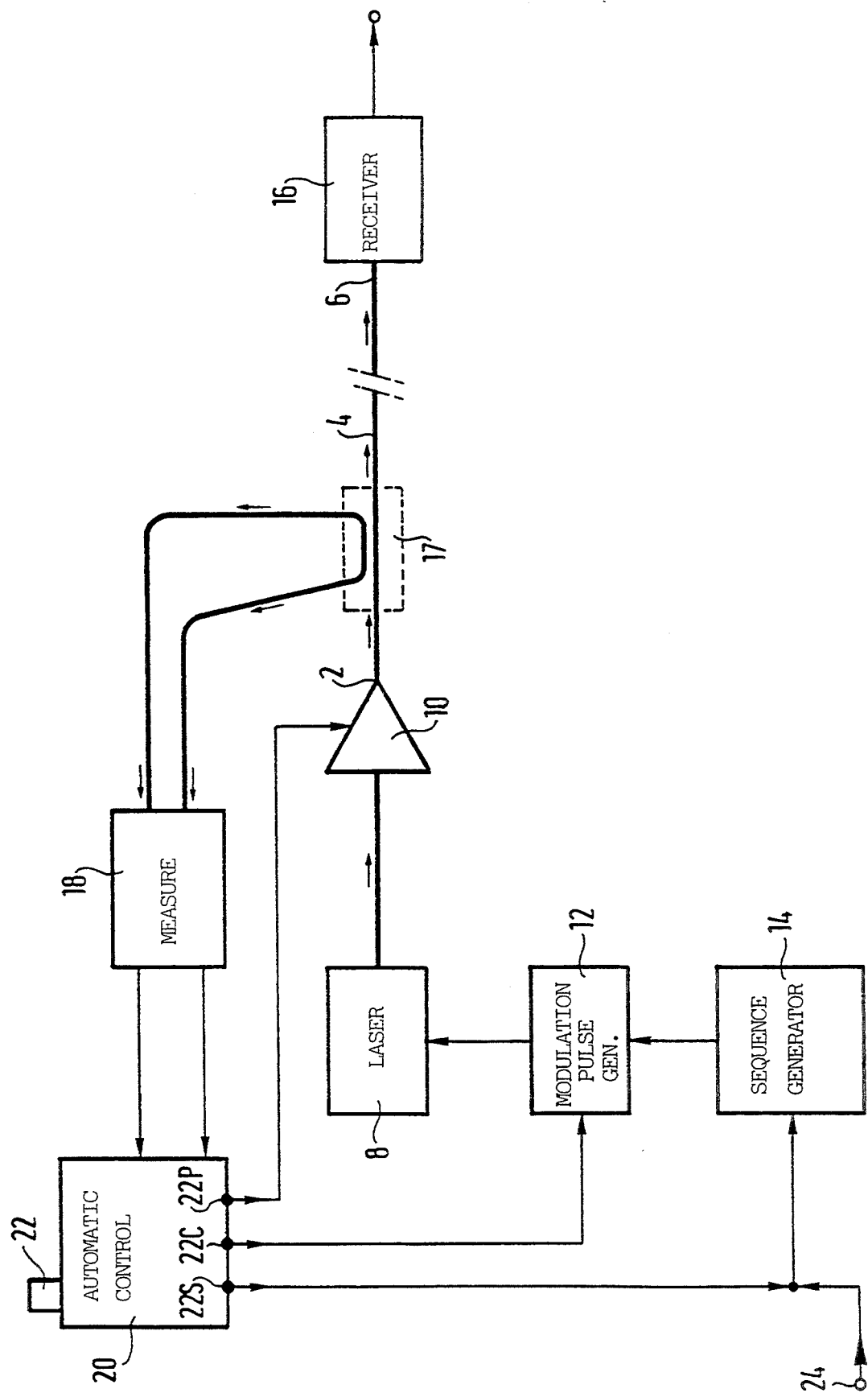

OPTICAL TELECOMMUNICATIONS METHOD

The present invention relates to optical fiber telecommunications, and more particularly to improving the quality of such telecommunications when transmitted data is carried in digital form by applying phase-modulation to a carrier light wave. The carrier wave and its modulation may be characterized by various parameters which are distinct from the data to be transmitted, and which affect the quality of transmission, i.e. which affect the error rate that appears on comparing the data as transmitted with the data as recovered on reception.

In order to give such parameters optimum values so as to minimize the error rate, it is known that such parameters can be made to vary, the variations in the error rate can be monitored, and those values of the parameters which cause the lowest error rates to appear can be chosen.

That parameter-adjustment method is complex and costly when a parameter must be adjusted periodically because of the natural drift of a component used on transmission.

For this reason, the present invention provides an optical telecommunications method in which data to be transmitted is carried by modulating a carrier wave which is injected into a line fiber, said method being characterized by the fact that parameters of an adjustment wave are defined such that injecting the adjustment wave into said line fiber generates a returned wave that is returned via said fiber by Brillouin scattering, one of said adjustment waves is formed, and an optimum value for a parameter to be adjusted of the carrier wave is defined as a function of the variations in the power of one of said returned waves that is returned by Brillouin scattering.

By way of non-limiting example, and with reference to the accompanying diagrammatic FIGURE, a more detailed description is given below of how the present invention may be implemented.

The FIGURE shows a data transmission system implementing the method of the invention.

Firstly, various indications are given relating to Brillouin scattering. Such scattering can be caused to occur in various transparent media by a high-intensity light wave. It can occur in the optical fibers of a telecommunications system as a result of using optical amplifiers. Such amplifiers enable the power of the waves injected into the optical fibers to be increased considerably. Average power of about 20 dBm (100 mW) and above is possible. Such power causes non-linear effects to occur in the fibers, which effects disturb transmission significantly. One of the most important effects is stimulated Brillouin scattering (SBS) because it occurs above a relatively low power threshold. Quite a full description of such scattering is given by Cotter. It is the result of the interaction of three waves: a light wave (the pump wave) created by electrostriction, a pressure wave which causes variation in the dielectric susceptibility of the medium, so that the pressure wave partially diffracts the incident wave, thereby forming a diffracted wave that is diffracted by stimulated Stokes scattering.

The main characteristics of stimulated Brillouin scattering in the fibers may be defined with reference to "Brillouin gain" which is the gain that the fiber applies to the diffracted wave. These characteristics are as follows:

The spectrum width $V_B$ of the Brillouin gain lies in the range 20 MHz to 100 MHz for monomode silica optical fibers. Said spectrum width is a function of the geometric shape of the fiber and of the type of dopants.

Said gain is a function of the spectrum width $V_L$ of the pump wave: for widths $V_L$ of not more than $V_B$, the gain is at its maximum, and it decreases in the ratio $V_B/V_L$ when $V_L$ is very much greater than $V_B$.

The diffracted wave is returned in the opposite direction from that of the pump wave. The frequency of the diffracted wave is less than that of the incident by a quantity $f_B = 2n\ V_s/L_p$ where n = refractive index;

$V_s$ = speed of sound in silica; and

Lp = wavelength of the pump wave.

For monomode fibers used over long-distance links, $f_B$ lies in the vicinity of 11 GHz.

Finally, Brillouin gain is sensitive to modulation of the pump wave due to the fact that the modulation has a direct effect on the spectrum of the pump wave. The greater the spectrum width due to the modulation compared with the spectrum width of the gain, the smaller the Brillouin gain. The Brillouin gain depends on the modulation format used (phase, frequency, or amplitude modulation). With phase modulation, Lichtman has demonstrated that the Brillouin gain depends on various modulation parameters. One such parameter is the spectrum width of the modulating sequence. It is a function of the rate of the data carried by the sequence, and it constitutes a "sequence parameter" (considered below).

Aoki has demonstrated that the Brillouin gain is also a function of the type of modulation encoding used.

The Brillouin threshold is defined as being the average incident wave power above which a wave is diffracted by Brillouin scattering. The Brillouin threshold is inversely proportional to the Brillouin gain.

Reference is made to the following documents:

Cotter: Stimulated Brillouin Scattering in monomode Optical Fibers (Jl of Optical Communications 4, (1983) 1, 10–19);

Lichtman: Stimulated Brillouin Scattering Excited by a Modulated Pump Wave in Single Mode Fibers (Jl of light wave Technology, vol 7, No. 1, January 1989); and Aoki: Input power limit of Single Mode Optical Fibers due to Stimulated Brillouin Scattering in Optical Communication Systems (Jl of lightwave Technology, vol 6, No. 5, May 1988).

A transmission method of the present invention includes the following known steps:

an incident wave presenting modulation carrying an input signal is injected into an input 2 of the line fiber 4; the incident wave with its modulation is defined by the values of transmission parameters and by an input signal carried by the modulation; said values of the parameters remain constant; at least two of said transmission parameters constitute adjustable parameters for which the values can be adjusted; at least one adjustable parameter constitutes a parameter to be adjusted for which the value must be defined and adjusted at successive times; an example of such a parameter is given below;

an optimum value is defined for each of said adjustable parameters;

said input signal is made to carry data to be transmitted; each of said adjustable parameters is adjusted for this purpose as close as possible to its optimum value; the input signal and the incident wave then respectively constitute a data signal and a carrier wave;

the carrier wave is received at an output 6 of said line fiber 4; and the received carrier wave is processed to recover said data to be transmitted.

The data recovered from the received carrier wave generally has an error rate. Except for the bandwidth of a data signal, the optimum values for the adjustable parameters are those which make the error rate minimal. The optimum bandwidth is that which is defined by the rate of the data to be transmitted.

In accordance with the present invention, the optimum value for the parameter to be adjusted is defined by the following steps:

an incident wave constituting an adjustment wave is injected into said line fiber 4;

a scanning parameter is chosen constituted by one of said adjustable parameters of said adjustment wave other than said parameter to be adjusted;

said scanning parameter is given various values, at least some of which are chosen to be different from its optimum value so that said line fiber presents Brillouin scattering which returns a diffracted wave whose power constitutes returned power;

variations in said returned power are detected; and said optimum value for said parameter to be adjusted is defined on the basis of the detected variations in said returned power.

A transmission system implementing the method includes the following elements:

a semiconductor laser source constituted by a semiconductor light emitter 8 and an amplifier 10; the source emits an incident wave when it receives a powering current, and a modulation current controls deviation of the frequency of the incident wave on either side of a predetermined average frequency;

a modulation pulse generator 12 supplies said modulation current in the form of modulation pulses that are successive and preferably alternating;

pulse size being constituted by the integral of pulse current over pulse duration, pulse size constituting said parameter to be adjusted;

the generator enables the value of the size to be adjusted to make it equal to an optimum value causing optimum phase deviation of said carrier wave; said optimum phase deviation is preferably 180 degrees;

a sequence generator 14 receiving said input signal and controlling said pulse generator 12 so that the pulse generator delivers a modulating sequence representative of the input signal; such a modulating sequence is obtained by said pulse generator supplying the modulation pulses at instants defined by the modulating sequence; a parameter of the input signal is free from data value; it is adjustable and it constitutes a sequence parameter; it may be constituted by the spectrum width of the signal;

the line fiber 4; the line fiber is naturally capable of returning one of said diffracted waves to said source 8, 10, the energy of which diffracted wave is taken from the energy of said incident wave by stimulated Brillouin scattering; the diffracted wave is formed and returned when incident power which is the power of the incident wave exceeds the Brillouin threshold; the threshold is dependent on the values of the adjustable parameters;

a receiver 16 which receives and detects the incident wave to recover said data to be transmitted;

detection may be heterodyne or direct; when detection is direct, the phase modulation is transformed into intensity modulation.

an optical coupler 17 for collecting predetermined fractions of the incident wave and of the diffracted wave travelling along the fiber 4;

a measuring member 18 for measuring the powers of the fractions, and therefore the incident power and the returned power; and an automatic adjustment member 20 receiving the incident power measurement and the returned power measurement; this member may be triggered either manually by means of a knob 22, or automatically, either when it appears necessary to re-adjust size, or at predetermined time intervals.

The member 20 has three outputs. One output 22P controls the incident power supplied by the amplifier 10. One output 22C modifies the currents of the pulses supplied by the pulse generator 12 so as to adjust the modulation size, the duration and the variation profile type of the pulses being predetermined. The other output 22S controls the sequence parameter. To this end, this output supplies an adjustment assistance signal which is free of data value, and which is transmitted to the sequence generator 14 to constitute the input signal during an adjustment step.

Outside the adjustment steps, during data transmission steps, the input signal is constituted by a data signal applied to an input 24 of the system.

During the adjustment steps, the incident power constitutes one of said scanning parameters, i.e., under the control of the adjustment member 20, the amplifier 10 causes the incident power to vary between a maximum value allowed by the source 8, 10 and a minimum value, to cause variations in the returned power. By means of the incident power measurements and of the returned power measurements, the adjustment member 20 determines the Brillouin threshold of the fiber 4. The adjustment member then causes the size of the modulation pulses to vary so as to maximize the Brillouin threshold measured in this way.

Preferably, the sequence parameter constitutes one of said scanning parameters which is used as follows. Before causing the incident power to vary, the adjustment member 20 gives the sequence parameter a value chosen so that the modulating sequence constitutes an adjustment assistance sequence giving the Brillouin threshold a value that is less than said maximum value for the incident power and that is less than the value which is given to the Brillouin threshold by said optimum value for the sequence parameter. Such adjustment assistance sequences are "fixed" sequences of relatively small spectrum width.

During the data transmission periods, the data signal gives the sequence parameter its optimum value. This enables the source 8, 10 to be used in the vicinity of its maximum power without any danger of causing an interfering diffracted wave to appear during data transmission.

In the above-described embodiment, the adjustment steps temporarily exclude the data transmission steps. All the transmission steps are then optimized, in the sense that each adjustable parameter is given its optimum value. However, it should be understood that one of said adjustment waves may simultaneously constitute one of said data carrier waves during non-optimized transmission steps that simultaneously constitute adjustment steps.

Advantageously, the method of the invention may be applied to a phase-modulated transmission system for which the phase shift is to be optimized at 180 degrees (or $(2k+1) \times 180$ degrees). The method then makes it possible to adjust the characteristics of the sensitivity of the frequency to the modulation current of the light emitter 8. The method may also be advantageously applied to an amplitude-modulated transmission system.

Measuring the incident power may be useful for controlling the power characteristics of the source.

With respect to measuring the returned power, it is possible to take into account the power which is backscattered by another effect known as Rayleigh scattering, and which is added to the power returned by Brillouin scattering. This backscattered power is generally negligible, and may be calculated by means of the incident power measurement.

I claim:

1. In a data transmission method comprising the steps of:
    modulating an optical carrier wave with the data to be transmitted, said modulated carrier wave having a first parameter to be adjusted, and
    injecting said modulated carrier wave into a near portion of a line fiber, said fiber extending between said near portion and a distant portion and being operative to guide said modulated carrier wave to said distant portion thereby transmitting said data,
    the improvement according to which said method further comprises the steps of:
    injecting an optical adjustment wave into said near portion of said line fiber for making a Brillouin backscattering of said adjustment wave to generate a return wave in said line fiber, said adjustment wave being free of said data and having at least one second parameter,
    varying a said at least one second parameter of said adjustment wave for making said return wave to have power variations,
    monitoring said power variations of said return wave from said near portion of said line fiber, and
    adjusting said first parameter to be adjusted of said carrier wave according to said monitored power variations of said return wave.

2. An optical transmission method according to claim 1, wherein the incident wave and its modulation being defined by the values of transmission parameters and by said input signal, said values of the parameters remaining constant, at least two of said transmission parameters constituting adjustable parameters for which the values can be adjusted, and at least one of said adjustable parameters constituting a parameter to be adjusted for which the value must be adjusted;
    said method further comprising transmission steps including:
    transmitting said input signal with data to be transmitted, said input signal and said incident wave then respectively constituting a data signal and a carrier wave;
    receiving said carrier wave at an output (6) of said line fiber (4); and
    processing the carrier wave at said output of the line fiber to recover said data to be transmitted, the data recovered from the carrier wave possibly having an error rate, the error rate being minimal when each of said adjustable parameters of said carrier wave is adjusted to the optimum value for the parameter, said optimum values for said adjustable parameters other than one of said parameters to be adjusted being predetermined optimum values;
    said method further comprising adjustment steps including:
    injecting one of said incident waves constituting an adjustment wave into said line fiber;
    choosing a scanning parameter constituted by one of said adjustable parameters of said adjustment wave other than said parameter to be adjusted;
    assigning said scanning parameter various values, at least some of which are chosen to be different from its optimum value so that said line fiber presents Brillouin scattering which returns a diffracted wave whose power constitutes returned power;
    detecting variations in said returned power; and
    defining said optimum value for said parameter to be adjusted on the basis of the detected variations in said returned power;
    optimizing at least some of said transmission steps in which said parameter to be adjusted of said carrier wave is given its optimum value defined by said adjustment steps, and each of the other ones of said adjustable parameters is given its predetermined optimum value.

3. A method according to claim 2, the method using a transmission system including:
    a semiconductor laser source (8-10) capable of transmitting an incident wave when it receives a powering current, a modulation current controlling deviation of the frequency of the incident wave in the vicinity of a predetermined frequency, so as to make frequency modulation of the incident wave carry said input signal;
    a modulation pulse generator (12) for supplying said modulation current in the form of successive modulation pulses, pulse size being constituted by the integral of pulse current over pulse duration, and constituting said parameter to be adjusted, the generator enabling the value of the size to be adjusted to make it equal to an optimum value causing optimum phase deviation of said carrier wave;
    a sequence generator (14) receiving said input signal and controlling said pulse generator (12) so that the pulse generator delivers a modulating sequence representative of the input signal, the modulating sequence being obtained by the said pulse generator supplying said modulation pulses at instants defined by the modulating sequence, a parameter of the input signal being free from data value and constituting a sequence parameter;
    said line fiber (4), the line fiber being capable of returning one of said diffracted waves to said source (8, 10), the energy of which diffracted wave is taken from the energy of said incident wave by stimulated Brillouin scattering, the diffracted wave being formed and returned when incident power which is the power of the incident wave exceeds a Brillouin threshold dependent on said adjustable parameters; and
    a receiver (16) receiving said incident wave at the output of said line fiber to recover said data to be transmitted.

4. A method according to claim 3, characterized by the fact that said optimum value of the modulation size is defined as the value which gives a maximum value to said Brillouin threshold, whereby said optimum value of the size causes optimum phase deviation equal to 180 degrees.

5. A method according to claim 4, characterized by the fact that said incident power constitutes one of said scanning parameters, the method including the following steps:

when said adjustment wave is injected into said line fiber, varying said incident power between a maximum value allowed by said source and a minimum value, to cause variations in said returned power;

measuring the incident power and the returned power to determine said Brillouin threshold; and adjusting said size to maximize the Brillouin threshold determined in this way.

6. A method according to claim 5, characterized by the facts that said sequence parameter constitutes a scanning parameter, and that, before said varying step during which said incident power is caused to vary, said method further comprising:

assigning said sequence parameter a value chosen so that said modulating sequence constitutes an adjustment assistance sequence giving said Brillouin threshold a value less than said maximum value for the incident power and less than the value which is given to said Brillouin threshold by said optimum value for the sequence parameter.

7. A method according to claim 3, in which method said modulation pulses have a predetermined duration and a predetermined variation profile type, said parameter to be adjusted being represented by an adjustable current for the pulses.

* * * * *